(12) United States Patent
Kunze et al.

(10) Patent No.: US 10,673,025 B2
(45) Date of Patent: Jun. 2, 2020

(54) ELECTRICAL STORAGE SYSTEM COMPRISING A SHEET-TYPE DISCRETE ELEMENT, DISCRETE SHEET-TYPE ELEMENT, METHOD FOR THE PRODUCTION THEREOF, AND USE THEREOF

(71) Applicant: SCHOTT AG, Mainz (DE)

(72) Inventors: Miriam Kunze, Saulheim (DE); Ulrich Peuchert, Bodenheim (DE); Nikolaus Schultz, Essenheim (DE); Thorsten Damm, Nieder-Olm (DE); Clemens Ottermann, Hattersheim (DE)

(73) Assignee: SCHOTT AG, Mainz (DE)

( * ) Notice: Subject to any disclaimer, the term of this patent is extended or adjusted under 35 U.S.C. 154(b) by 58 days.

(21) Appl. No.: 15/611,187

(22) Filed: Jun. 1, 2017

(65) Prior Publication Data

US 2017/0263900 A1 Sep. 14, 2017

Related U.S. Application Data

(63) Continuation of application No. PCT/EP2015/077794, filed on Nov. 26, 2015.

(30) Foreign Application Priority Data

Dec. 1, 2014 (DE) .......... 10 2014 117 633
Mar. 16, 2015 (DE) .......... 10 2015 103 857
(Continued)

(51) Int. Cl.
*H01M 2/02* (2006.01)
*C03C 3/085* (2006.01)
(Continued)

(52) U.S. Cl.
CPC .......... *H01M 2/0207* (2013.01); *C03C 3/078* (2013.01); *C03C 3/083* (2013.01); *C03C 3/085* (2013.01);
(Continued)

(58) Field of Classification Search
None
See application file for complete search history.

(56) References Cited

U.S. PATENT DOCUMENTS 2,247,331 A 6/1941 Ferguson
4,168,351 A 9/1979 Taylor
(Continued)

FOREIGN PATENT DOCUMENTS

CA -2330763 A1 * 7/2001
CN 102167509 8/2011
(Continued)

OTHER PUBLICATIONS

English translation of International Search Report dated Jun. 6, 2016 for corresponding PCT/EP2015/077794, 3 pages.
(Continued)

*Primary Examiner* — Scott J. Chmielecki
(74) *Attorney, Agent, or Firm* — Ohlandt, Greeley, Ruggiero & Perle, L.L.P.

(57) ABSTRACT

An electrical storage system is provided that has a thickness of less than 2 mm, where the system includes at least one sheet-type discrete element, the sheet-type discrete element exhibiting high resistance to an attack of alkali metals or alkali metal ions, in particular lithium, wherein the sheet-type discrete element has a low content of $TiO_2$, the $TiO_2$ content preferably being less than 2 wt %, preferably less than 0.5 wt %, and preferably free of $TiO_2$.

35 Claims, 4 Drawing Sheets

(30) Foreign Application Priority Data

Mar. 16, 2015 (DE) .................. 10 2015 103 863
Jun. 23, 2015 (TW) ........................ 104120251 A

(51) Int. Cl.

| | | |
|---|---|---|
| *C03C 3/093* | (2006.01) | |
| *C03C 3/095* | (2006.01) | |
| *C03C 3/091* | (2006.01) | |
| *H01M 2/08* | (2006.01) | |
| *H01M 10/0525* | (2010.01) | |
| *H01M 10/0585* | (2010.01) | |
| *H01M 6/40* | (2006.01) | |
| *H01M 10/04* | (2006.01) | |
| *C23C 14/34* | (2006.01) | |
| *C23C 14/06* | (2006.01) | |
| *C03C 3/078* | (2006.01) | |
| *C03C 3/083* | (2006.01) | |
| *C03C 3/087* | (2006.01) | |
| *C03C 3/097* | (2006.01) | |

(52) U.S. Cl.
CPC .............. *C03C 3/087* (2013.01); *C03C 3/091* (2013.01); *C03C 3/093* (2013.01); *C03C 3/095* (2013.01); *C03C 3/097* (2013.01); *C23C 14/0676* (2013.01); *C23C 14/3414* (2013.01); *H01M 2/028* (2013.01); *H01M 2/0267* (2013.01); *H01M 2/0292* (2013.01); *H01M 2/08* (2013.01); *H01M 6/40* (2013.01); *H01M 10/0436* (2013.01); *H01M 10/0525* (2013.01); *H01M 10/0585* (2013.01); *H01M 2002/0297* (2013.01)

(56) References Cited

U.S. PATENT DOCUMENTS

| | | | |
|---|---|---|---|
| 5,338,625 A | 8/1994 | Bates | |
| 5,532,869 A * | 7/1996 | Goldner | G02F 1/1533 359/275 |
| 6,214,061 B1 | 4/2001 | Visco | |
| 6,387,563 B1 | 5/2002 | Bates | |
| 6,398,824 B1 | 6/2002 | Johnson | |
| 6,906,436 B2 | 6/2005 | Jenson | |
| 6,982,132 B1 | 1/2006 | Goldner | |
| 7,211,351 B2 | 5/2007 | Klaassen | |
| 7,494,742 B2 * | 2/2009 | Tarnowski | H01M 2/0207 429/162 |
| 7,776,478 B2 | 8/2010 | Klaassen | |
| 8,228,023 B2 | 7/2012 | Sather | |
| 8,420,252 B2 | 4/2013 | Shakespeare | |
| 2001/0032666 A1 | 10/2001 | Jenson | |
| 2002/0015887 A1 | 2/2002 | Gao | |
| 2004/0018424 A1 | 1/2004 | Zhang | |
| 2004/0029311 A1 | 2/2004 | Snyder | |
| 2004/0186000 A1 | 9/2004 | Kawamoto | |
| 2004/0219424 A1 | 11/2004 | Kanno | |
| 2005/0037911 A1 | 2/2005 | Fechner | |
| 2005/0147877 A1 | 7/2005 | Tarnowski | |
| 2006/0006786 A1 | 1/2006 | Fechner | |
| 2006/0062904 A1 | 3/2006 | West | |
| 2006/0152137 A1 * | 7/2006 | Beteille | B32B 17/10036 313/503 |
| 2006/0216589 A1 | 9/2006 | Krasnov | |
| 2008/0001577 A1 | 1/2008 | Sather | |
| 2008/0003492 A1 | 1/2008 | Bates | |
| 2008/0003493 A1 | 1/2008 | Bates | |
| 2008/0032236 A1 | 2/2008 | Wallace | |
| 2008/0213664 A1 | 9/2008 | Krasnov | |
| 2008/0263855 A1 | 10/2008 | Li | |
| 2009/0057136 A1 | 3/2009 | Wang | |
| 2009/0101199 A1 * | 4/2009 | Carroll | C03C 8/10 136/252 |
| 2009/0186270 A1 | 7/2009 | Harada | |
| 2009/0214899 A1 | 8/2009 | Shakespeare | |
| 2010/0104942 A1 | 4/2010 | Lange | |
| 2010/0136245 A1 | 6/2010 | Albano | |
| 2010/0190051 A1 | 7/2010 | Aitken | |
| 2010/0190414 A1 * | 7/2010 | Harada | B24B 7/241 451/41 |
| 2010/0233548 A1 * | 9/2010 | Pijnenburg | H01M 4/13 429/322 |
| 2011/0094584 A1 | 4/2011 | Sawada | |
| 2011/0098171 A1 | 4/2011 | Pedeboscq | |
| 2011/0104034 A1 | 5/2011 | Mills | |
| 2011/0135857 A1 * | 6/2011 | Logunov | C03C 8/08 428/34.6 |
| 2011/0190250 A1 | 8/2011 | Yamashita | |
| 2011/0281167 A1 | 11/2011 | Sabi | |
| 2011/0302962 A1 | 12/2011 | Gattermann | |
| 2012/0040211 A1 * | 2/2012 | Murata | C03B 17/064 429/9 |
| 2012/0050942 A1 | 3/2012 | Kim | |
| 2012/0058260 A1 * | 3/2012 | Arsten | C03C 17/006 427/162 |
| 2013/0098532 A1 | 4/2013 | Liang | |
| 2013/0236666 A1 | 9/2013 | Bookbinder | |
| 2013/0260230 A1 | 10/2013 | Liang | |
| 2013/0344321 A1 | 12/2013 | McSporran | |
| 2014/0030449 A1 | 1/2014 | Song | |
| 2014/0186590 A1 | 7/2014 | Ryu | |
| 2014/0216108 A1 | 8/2014 | Wiegel | |
| 2014/0261662 A1 | 11/2014 | Takeda | |
| 2014/0342267 A1 * | 11/2014 | Parihar | H01M 8/2483 429/465 |
| 2014/0356694 A1 | 12/2014 | Yoon | |
| 2015/0064411 A1 | 3/2015 | Sasai | |
| 2015/0079389 A1 | 3/2015 | Krawinkel | |
| 2015/0083192 A1 * | 3/2015 | Nobori | H01L 31/052 136/246 |
| 2015/0162568 A1 | 6/2015 | Bai | |
| 2015/0207184 A1 | 7/2015 | Kunze | |
| 2016/0005548 A1 * | 1/2016 | Logunov | H01G 9/2077 428/34.6 |
| 2018/0226311 A1 * | 8/2018 | Katayama | C03C 19/00 |

FOREIGN PATENT DOCUMENTS

| | | |
|---|---|---|
| DE | 2904396 | 8/1979 |
| DE | 3128863 | 2/1983 |
| DE | 68903980 | 6/1993 |
| DE | 19810325 | 9/1999 |
| DE | 102010023176 | 12/2011 |
| DE | 102011084128 | 4/2013 |
| DE | 102012207424 | 6/2013 |
| DE | 102012206273 | 10/2013 |
| DE | 102012211335 | 1/2014 |
| EP | 2234188 | 9/2010 |
| EP | 2434567 | 3/2012 |
| JP | S5266512 | 6/1977 |
| JP | S54113618 | 9/1979 |
| JP | 2005041768 | 2/2005 |
| JP | 2006056770 | 3/2006 |
| JP | 2006306721 | 11/2006 |
| JP | 2007123081 | 5/2007 |
| JP | 2009161437 | 7/2009 |
| JP | 2009181920 | 8/2009 |
| JP | 2010073551 | 4/2010 |
| JP | 2010231969 | 10/2010 |
| JP | 2011054438 | 3/2011 |
| JP | 2011098852 | 5/2011 |
| JP | 2012508446 | 4/2012 |
| JP | 2013026187 | 2/2013 |
| JP | 2014500847 | 1/2014 |
| JP | 2014508091 | 4/2014 |
| JP | 2014099331 | 5/2014 |
| KR | 1020090061269 | 6/2009 |
| KR | 1020120040683 | 4/2012 |
| KR | 101313156 | 9/2013 |
| WO | 2009119933 | 10/2009 |
| WO | 2013035519 | 3/2013 |

(56) References Cited

FOREIGN PATENT DOCUMENTS

| WO | 2013050166 | 4/2013 |
| WO | 2013089347 | 6/2013 |
| WO | 2013141481 | 9/2013 |
| WO | 2013168592 | 11/2013 |
| WO | 2014012696 | 1/2014 |
| WO | 2014016039 | 1/2014 |
| WO | 2014062676 | 4/2014 |
| WO | 2014139147 | 9/2014 |

OTHER PUBLICATIONS

ISO 7884-8, "Glass—Viscosity and viscometric fixed point—Part 8: Determination of (dilatometric) transformation temperature", Dec. 15, 1987, 8 pages.

ISO 7991, "Glass—Determination of coefficient of mean linear thermal expansion", Dec. 15, 1987, 12 pages.

English translation of Ensling, "Photoelectron spectroscopy examination of the electronic structure of thin lithium"; cobalt oxide layers, dissertation, Technische Universitat Darmstadt, 2006, 3 pages.

English translation of Tintignac et al., "Electrochemical properties of high rate bias sputtered $LiCoO_2$ thin films in liquid electrolyte", Journal of Power Sources, vol. 245, 2014, pp. 76-82.

English translation of International Search Report dated Dec. 18, 2015 for corresponding PCT/EP2015/064069.

English translation of International Preliminary Report on Patentability dated Dec. 29, 2016 for corresponding PCT/EP2015/064069, 19 pages.

English translation of International Preliminary Report on Patentability dated Dec. 29, 2016 for corresponding PCT/EP2015/064058, 7 pages.

English translation of International Search Report dated Sep. 24, 2015 for corresponding PCT/EP2015/064058, 3 pages.

Song et al., "In situ visible Raman spectroscopic study of phase change in $LiCoO_2$ film by laser irradiation", Chemical Physics Letters, vol. 344, Aug. 24, 2001, pp. 299-304, 6 pages.

English translation of International Search Report dated Dec. 11, 2015 for corresponding PCT/EP2015/064064, 3 pages.

English translation of Written Opinion dated Dec. 11, 2015 for corresponding PCT/EP2015/064064, 13 pages.

English translation of International Preliminary Report on Patentability dated Jan. 5, 2017 for corresponding PCT/EP2015/064064, 16 pages.

English translation of International Search Report dated Dec. 18, 2015 for corresponding PCT/EP2015/064060, 3 pages.

English translation of International Preliminary Report on Patentability dated Dec. 29, 2016 for corresponding PCT/EP2015/064060, 9 pages.

Maeda et al., "Diffusion of Li in the silicon oxide films and evaluation of Li-induced surface potential", Applied Surface Science, vol. 244, Issues 1-4, May 15, 2005, pp. 61-64.

English translation of International Preliminary Report on Patentability dated Jun. 15, 2017 for corresponding PCT/ EP2015/077923, 12 pages.

English translation of International Search Report dated Jan. 26, 2016 for corresponding PCT/EP2015/077923, 3 pages.

\* cited by examiner

Fig. 1

| | EE19 | EE20 | EE21 | CE1 | CE2 | EE22 | EE23 | EE24 | EE25 | CE3 | EE26 | EE27 | EE28 | EE29 | EE30 | EE31 | EE32 | CE4 |
|---|---|---|---|---|---|---|---|---|---|---|---|---|---|---|---|---|---|---|
| $SiO_2$ | 61.0 | 59.92 | 50.5 | 64.0 | 62.65 | 66.49 | 65.2 | 80.7 | 69.5 | 65.0 | 62.2 | 66.06 | 60.7 | 61.2 | 65.7 | 66.9 | 67.5 | 64.1 |
| $Al_2O_3$ | 18.0 | 17.27 | 11.0 | 4.0 | 4.11 | 4.35 | 4.27 | 2.4 | | 22.0 | 18.1 | 17.95 | 16.9 | 19.6 | 17.8 | 4.4 | 4.4 | 4.2 |
| $B_2O_3$ | 10.0 | 10.22 | 14.0 | 8.3 | 8.19 | 8.7 | 8.53 | 12.7 | | | 0.2 | 3.94 | | 4.5 | 3.8 | 8.7 | 8.8 | 8.4 |
| $TiO_2$ | | | | 4.0 | 3.9 | | | | 0.3 | 2.5 | | | | | | | | 4.2 |
| $Li_2O$ | | 1.86 | | | 1.87 | | 1.94 | | | 3.5 | 5.2 | 4.36 | | | 3.85 | | | |
| $Na_2O$ | | | | 6.5 | 6.3 | 6.68 | 6.55 | 3.5 | 8.3 | 0.5 | 9.7 | 1.23 | 12.2 | 12.1 | 1.55 | 6.7 | 9.6 | 6.4 |
| $K_2O$ | | | | 5.5 | 6.72 | 7.13 | 6.99 | 0.6 | 8.4 | | 0.1 | 0.3 | 4.1 | 0.9 | 0.3 | 7.2 | 3.4 | 6.9 |
| $MgO$ | 2.8 | 2.86 | | | | | | | | 0.5 | | 0.05 | 3.9 | 1.2 | 3.7 | | | |
| $CaO$ | 4.8 | 4.55 | | | | | | | 5.7 | | 0.6 | 3.78 | | 0.1 | 0.15 | 6.1 | 6.2 | 5.8 |
| $ZnO$ | | | | 7.0 | 5.52 | 5.86 | 5.75 | | 4.5 | 2.0 | 0.1 | | | | 0.5 | | | |
| $SrO$ | | | | | | | | | | | 0.1 | 0.52 | | | | | | |
| $BaO$ | 3.3 | 3.12 | 24.0 | | | | | | 2.1 | 2.0 | | 0.71 | | 0.3 | 0.7 | | | |
| $CeO_2$ | | | | | | | | | | | 3.6 | 0.95 | 1.5 | | 0.8 | | | |
| $ZrO_2$ | | | | 0.6 | 0.74 | 0.78 | 0.77 | | 0.5 | 2.0 | | | | | | | | |
| $Sb_2O_3$ | | | 0.5 | | | | | | | | | | | | | | | |
| $As_2O_3$ | | | | | | | | | | | | | | | | | | |
| $SnO_2$ | 0.1 | 0.19 | | | | | | | | | | 0.05 | 0.4 | 0.2 | 0.15 | | | |
| $Cl$ | | | | 0.1 | | | | | | | | | | | | | | |
| $SeO_2$ | | | | | | | | | | | | | | | | 0.03 | 0.03 | 0.03 |
| $P_2O_5$ | | | | | | | | | | | | | | | 0.7 | | | |
| Total | 100.0 | 99.99 | 100.0 | 100.0 | 100.0 | 99.99 | 100.0 | 99.9 | 99.3 | 100.0 | 99.9 | 99.9 | 99.7 | 100.0 | 99.7 | | | |
| $\alpha_{(20-300)}$ | 3.2 | | | 7.2 | | | | 3.25 | 9.4 | | 8.5 | | | 8.9 | 5.2 | | | |
| $T_g$ | 717 | | | 557 | | | | 525 | 533 | | 505 | | | 600 | 580 | | | |
| Density | 2.43 | | | 2.5 | | | | 2.2 | 2.55 | | 2.5 | | | 2.4 | 2.42 | | | |
| Contact with metallic lithium (method: pressed Li⁰ metal) | | | | | | | | | | | | | | | | | | |
| Visually | ++ | ++ | ++ | -- | - | + | ++ | ++ | + | -- | ++ | ++ | ++ | ++ | ++ | | | |
| REM | ++ | ++ | ++ | -- | | | ++ | + | + | -- | | | | | | | | |
| Contact with LiNO₃ (Method: Li⁺ salt bath) | | | | | | | | | | | | | | | | | | |
| Visually | ++ | ++ | ++ | - | + to 0 | + | | | | | | | | | | + | + | - |
| ToF SIMS | 0 | | | | | 0 | 0 | | | | | | | | | | | 0 |
| Contact with metallic lithium (method: Li⁰ vapor deposition) | | | | | | | | | | | | | | | | | | |
| | | | | | | | | | | | - | + | + | - | ++ | + | + | |
| Contact with LiPON (method: Li⁺ sputter deposition) | | | | | | | | | | | | | | | | | | |
| | | | | | | | | | | | - | | | - | | + | + | 0 |

Fig. 7a
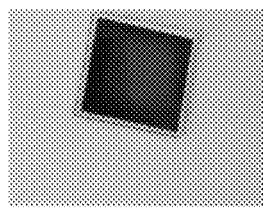
CE 1
Fig. 7b
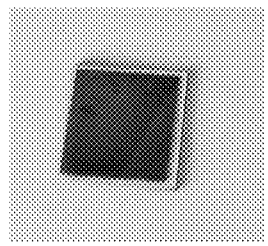
CE 3
Fig. 7c                                           Fig. 7d
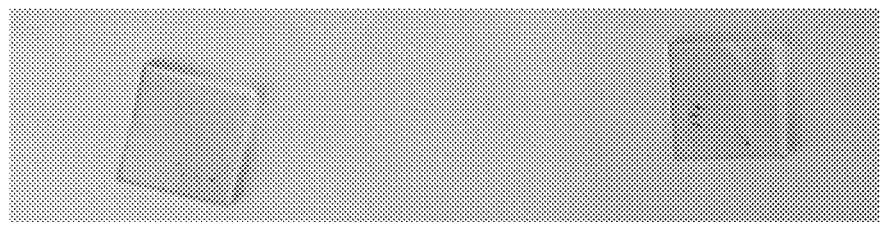
EE 31                                              EE 32
Fig. 7e
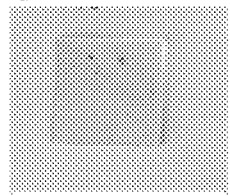
EE 28

ELECTRICAL STORAGE SYSTEM COMPRISING A SHEET-TYPE DISCRETE ELEMENT, DISCRETE SHEET-TYPE ELEMENT, METHOD FOR THE PRODUCTION THEREOF, AND USE THEREOF

CROSS REFERENCE TO RELATED APPLICATIONS

This application is a continuation of International Application No. PCT/EP2015/077794 filed on Nov. 26, 2015, which claims the benefit under 35 U.S.C. 119 of German Application No. 102014117633.2 filed on Dec. 1, 2014, German Application No. 102015103857.9 filed on Mar. 16, 2015, German Application No. 102015103863.3 filed on Mar. 16, 2015, and Taiwanese Application No. 104120251 filed on Jun. 23, 2015, the entire contents of all of which are incorporated by reference herein.

BACKGROUND

1. Field of the Invention

The invention relates to an electrical storage systems comprising a sheet-type discrete element, to a discrete sheet-type element, a method for the production thereof, and its use.

2. Description of Related Art

Electrical storage systems have long been state of the art and include in particular batteries, but also high energy density capacitors, known as supercaps. Since high energy densities can also be realized with lithium-ion batteries, the latter are in particular also being discussed in the field of novel applications, such as electromobility, although having already been used for a number of years in portable devices such as smartphones or laptop computers. These conventional rechargeable lithium-ion batteries are in particular characterized by the use of organic solvent-based liquid electrolytes. As the latter are inflammable, they lead to safety concerns regarding the unrestricted use thereof. One way of avoiding organic electrolytes is to use solid electrolytes. However, such a solid electrolyte has a conductivity that is usually clearly smaller, i.e. by several orders of magnitude, than that of a corresponding liquid electrolyte. In order to nevertheless achieve acceptable conductivities and to be able to exploit the advantages of a rechargeable lithium-ion battery, such solid-state batteries are nowadays especially produced in the form of so-called thin film batteries (TFB) or thin film storage elements which find their use in particular in mobile applications, for example in so-called smart cards, in medical technology and sensor technology as well as in smartphones and other portable applications which require smart, miniaturized and possibly even flexible power sources.

An exemplary lithium-based thin film storage element has been described in US 2008/0001577 and basically consists of a substrate on which the electronically conductive collectors for the two electrodes are deposited in a first coating step. In the further manufacturing process, the cathode material is first deposited on the cathode collector, usually lithium cobalt oxide, LCO. In the next step, a solid electrolyte is deposited, which is usually an amorphous material including the substances lithium, oxygen, nitrogen, and phosphorus, and which is referred to as LiPON. In the next step, an anode material is deposited so as to be in contact with the substrate, the anode collector, and the solid electrolyte. In particular metallic lithium is used as the anode material. When the two collectors are connected in electrically conductive manner, lithium ions will migrate through the solid-state ion conductor from the anode to the cathode in the charged state, resulting in a current flow from the cathode to the anode through the electrically conductive connection of the two collectors. Vice versa, in the non-charged state migration of the ions from the cathode to the anode can be enforced by applying an external voltage, whereby the battery is charged.

A further thin film storage element is described in US 2001/0032666 A1 by way of example, and also comprises a substrate onto which different functional layers are deposited.

The layers deposited for such a thin film storage element usually have a layer thickness of about 20 µm or less, typically less than 10 µm or even less than 5 µm; a total thickness of the layer structure can be assumed to be 100 µm or less.

In the context of the present application, thin film storage elements refer to rechargeable lithium-based thin film storage elements and supercaps, by way of example; however the invention is not limited to these systems but may as well be used in other thin film storage elements, e.g. rechargeable and/or printed thin film cells.

A thin film storage element is generally manufactured using complex coating processes also including patterned deposition of the individual materials. Very complex patterning of the exact thin film storage elements is possible, as can be seen from U.S. Pat. No. 7,494,742 B2, for example. In case of lithium-based thin film storage elements, particular difficulties are moreover encountered due to the use of metallic lithium as an anode material because of the high reactivity thereof. For example, metallic lithium has to be handled under preferably water-free conditions since otherwise it would react to form lithium hydroxide and the functionality as an anode would no longer be ensured. Accordingly, a lithium-based thin film storage element must also be protected against moisture by an encapsulation.

U.S. Pat. No. 7,494,742 B2 describes such an encapsulation for the protection of non-stable constituents of a thin film storage element, such as, e.g., lithium or certain lithium compounds. The encapsulation function is here provided by a coating or a system of different coatings which may fulfill further functions as part of the overall design of the battery.

In addition, as described in document US 2010/0104942 A1 by way of example, under the manufacturing conditions of a lithium-based thin film storage element, in particular during so-called annealing or heat treatment steps which are necessary for the formation of crystal structures suitable for lithium intercalation, undesirable side reactions of the mobile lithium ions with the substrate may occur, since lithium exhibits high mobility and can easily diffuse into common substrate materials.

A further issue with thin film storage elements relates to the substrate materials employed. Prior art describes a multiplicity of different substrate materials, such as, for example, silicon, mica, various metals, and ceramic materials. The use of glass is also often mentioned, but essentially without further details on the particular composition or precise properties of the glass.

US 2001/0032666 A1 describes a capacitor-type energy storage which may for instance be a lithium-ion battery. Here, semiconductors are mentioned as substrate materials, inter alia.

U.S. Pat. No. 6,906,436 B2 describes a solid state battery in which metal foils, semiconductor materials or plastic films can be used as substrate materials, for example.

U.S. Pat. No. 6,906,436 B2 describes a variety of possibilities for optional substrate materials, for example metals or metal coatings, semiconducting materials or insulators such as sapphire, ceramics, or plastics. Different geometries of the substrate are possible.

In U.S. Pat. No. 7,494,742 B2, metals, semiconductors, silicates, and glass, as well as inorganic or organic polymers are described as substrate materials, inter alia.

U.S. Pat. No. 7,211,351 B2 mentions metals, semiconductors, or insulating materials and combinations thereof as substrates.

US 2008/0001577 A1 mentions semiconductors, metals, or plastic films as substrates.

EP 2434567 A2 mentions, as substrates, electrically conductive materials such as metals, insulating materials such as ceramics or plastics, and semiconducting materials such as, e.g., silicon, and combinations of semiconductors and conductors or more complex structures for adapting the coefficient of thermal expansion. These or similar materials are also mentioned in documents US 2008/0032236 A1, U.S. Pat. No. 8,228,023 B2, and US 2010/0104942 A1.

By contrast, US 2010/0104942 A1 describes, as substrate materials that are relevant in practice, only substrates made of metals or metal alloys having a high melting point, and dielectric materials such as high quartz, silicon wafers, aluminum oxide, and the like. This is due to the fact that for producing a cathode from the usually employed lithium cobalt oxide (LCO), a temperature treatment at temperatures of more than 400° C., even more than 500° C. and above is necessary in order to obtain a crystal structure that is particularly favorable for storing Li+ ions in this material, so that materials such as polymers or inorganic materials with low softening points cannot be used. However, metals or metal alloys as well as dielectric materials have several shortcomings. For example, dielectric materials are usually brittle and cannot be used in cost-efficient roll-to-roll processes, while metals or metal alloys, on the other hand, tend to oxidize during a high-temperature treatment of the cathode material. In order to circumvent these difficulties, US 2010/0104942 A1 proposes a substrate made of different metals or silicon, wherein the redox potentials of the combined materials are adapted to each other so that controlled oxide formation occurs.

Furthermore, many publications discuss how to circumvent the high temperature resistance of the substrate which is required, for example, in the aforementioned US 2010/0104942 A1. By adapting process conditions, for example, substrates with a temperature resistance of 450° C. or below can be used. However, prerequisites for this are deposition processes in which the substrate is heated and/or the sputtering gas mixture of $O_2$ and Ar is optimized and/or a bias voltage is applied and/or a second sputtering plasma is applied in the vicinity of the substrate. This is discussed, for example, in US 2014/0030449 A1, in Tintignac et al., Journal of Power Sources 245 (2014), 76-82, or else in Ensling, D., Photoelectron spectroscopy examination of the electronic structure of thin lithium cobalt oxide layers, dissertation, Technical University of Darmstadt, 2006. In general, however, such process engineering adaptations are expensive and, depending on the processing, are hardly implementable in a cost-effective manner, especially if in-line coating of wafers is envisaged.

US 2012/0040211 A1 discloses a glass film as a substrate, which has a thickness of at most 300 μm and a surface roughness of not more than 100 Å. This low surface roughness is required because the layers of a thin film storage element generally have very low layer thicknesses. Even small unevenness of the surface may have a critical adverse effect on the functional layers of the thin film storage element and may thus result in failure of the battery as a whole. The same applies to document WO 2014/062676 A1 which claims thin film batteries using borosilicate glass or soda-lime glass. Again, information on thickness variations of the substrate are not given there.

Therefore, problems of conventional thin film storage elements are related to the corrosion susceptibility of the employed materials, in particular if metallic lithium is used, which implies complex layer structures and hence usually causes high costs, and are also related to the type of the substrate which should in particular be non-conductive but flexible, should exhibit high temperature resistance and should preferably be inert to the functional layers of the storage element used, and moreover should allow for deposition of layers preferably free of defects and with good layer adhesion on the substrate. However, it has been found that even with substrates having a particularly low surface roughness such as the glass film proposed in US 2012/0040211 A1, for example, failure of layers may occur as a result of cracks and/or detachment of the layers, as described in US 2014/0030449 A1, for example. The method for avoiding high annealing temperatures proposed therein, namely by applying a bias voltage when creating the lithium cobalt oxide layer, however, is difficult to implement in the common in-line processes for producing thin film storage elements, as already described above, so that from a process engineering point of view it is more favorable to use a substrate having a correspondingly high temperature resistance.

Another problem that is inherent to all substrate materials regardless of their exact composition relates to one of the possible handling procedures for ultra-thin glass. This so-called carrier solution consists of temporarily fixing ultra-thin glass on a support prior to or during the coating process or the transfer process steps. This may optionally be achieved using electrostatic forces, or by using an organic, detachable adhesive compound. In particular in the latter case it has to be ensured, by suitable choice of the substrate or of the carrier which are usually made from the same material, that debonding, that means detachment of the substrate from the carrier is possible. The debonding often provokes the occurrence of torsional stresses in the substrate, which stresses may furthermore be transferred to the layers deposited on the substrate, which also leads to cracks and detachment of the layers, so that as a result the layer defects caused by thickness variations of the substrate may further aggravate.

SUMMARY

Some processing steps in the fabrication of thin film electrical storage elements may, in principle, be performed by using high-energy optical energy sources such as, for example, excimer lasers. In order to allow for all processing options, for example cutting wafers by means of lasers or curing of organic adhesive materials by UV sources, a selectively modifiable UV transmittance of the substrate material is advantageous.

An object of the invention is to provide an electrical storage system which comprises a sheet-type discrete element, the sheet-type discrete element, and the production and use thereof.

A further object of the present invention is to provide an electrical storage element, in particular a thin film storage element, which mitigates the problems of current prior art and provides for cost-effective manufacturing of thin film storage elements. A further object of the invention is to provide a sheet-type element for use in an electrical storage element, and a way for producing same and use thereof.

The sheet-type discrete element should exhibit sufficient thermal stability of >300° C., preferably >400° C., together with sufficient resistance against contamination by battery components, furthermore a high barrier effect against moisture, and should provide an optical transmittance or blocking behavior to UV radiation adapted to the fabrication processes and requirements of the specific cell design. Moreover, the substrate should contribute to good adhesion of applied layers, i.e. should in particular have an appropriate expansion coefficient with respect to the deposition of the closest layer, usually the LCO.

Furthermore, the substrate and also superstrate according to the present invention should also exhibit high resistance to the attack of alkali metals or ions of alkali metals, in particular lithium.

The object of the invention is surprisingly easily achieved by incorporating, into a thin film storage element, a sheet-type discrete element which exhibits high resistance against the attack of alkali metals or ions of alkali metals, in particular lithium, the sheet-type discrete element having a composition which is characterized by a content of at most 2 wt % of $TiO_2$, preferably by at most 0.5 wt % of $TiO_2$, and is most preferably free of $TiO_2$.

In a further embodiment of the invention, the at least one sheet-type discrete element having a low $TiO_2$ content contains lithium or comprises lithium. Discrete sheet-type elements are considered as comprising lithium if lithium is present on or in the bulk material. Discrete sheet-type elements are considered as containing lithium if lithium is present preferably in the bulk material. The lithium may be present in the form of an oxide and also as a metal, for example also on the surface of the discrete sheet-type element. According to one embodiment of the invention, the sheet-type discrete element with low $TiO_2$ content has an $Li_2O$ content of 7.0 wt % or less, preferably of 5.2 wt % or less, and more preferably of 2.5 wt % or less, yet more preferably of 0.5 wt % or less, and most preferably of 0.2 wt % or less, wherein the content of $Li_2O$ is at least 0.1 wt %, and wherein, furthermore, the concentration of lithium may vary over the cross section of the sheet-type discrete element.

In a further preferred embodiment of the invention, at least one surface of the at least one sheet-type discrete element is designed so as to be inert and/or permeable to a reduced degree and/or impermeable to materials coming into contact with this surface.

The at least one surface is preferably designed as a barrier or barrier layer.

In a further embodiment of the invention, the barrier is designed as a barrier against the diffusion of metals.

In a further preferred embodiment of the invention, the barrier layer is designed as a barrier against the diffusion of alkali metals.

The barrier layer is preferably formed by doping or overdoping with at least one alkali metal and/or alkaline earth metal.

In a further particularly preferred embodiment of the invention, the barrier effect of the at least one surface is directed against lithium.

In a further embodiment of the invention, the at least one sheet-type discrete element comprises at least one oxide or a mixture or compound of a plurality of oxides.

In a preferred embodiment of the invention, the sheet-type discrete element contains $SiO_2$ as an oxide.

The sheet-type discrete element preferably has a composition which is characterized by a $TiO_2$ content of at most 2 wt %, preferably at most 0.5 wt % of $TiO_2$, and is most preferably free of $TiO_2$.

Preferably, the sheet-type discrete element of the present invention has the following composition, in wt %:

| | |
|---|---|
| $SiO_2$ | 58 to 65 |
| $B_2O_3$ | 6 to 10.5 |
| $Al_2O_3$ | 14 to 25 |
| $Li_2O$ | 0 to 7, preferably 0.1 to 7, most preferably 0.2-5.2 |
| MgO | 0 to 5 |
| CaO | 0 to 9 |
| BaO | 0 to 8, preferably 3 to 8 |
| SrO | 0 to 8 |
| ZnO | 0 to 2, | wherein the total of the contents of MgO, CaO, SrO, and BaO is in a range from 8 to 18 wt % and wherein further elements may also be included in the form of impurities or necessary processing-related additives, for example refining agents, wherein a total of these constituent elements amount to not more than 2 wt %.

In yet a further embodiment of the invention, the sheet-type discrete element has a total thickness variation (ttv) in a range <25 µm, preferably <15 µm, more preferably <10 µm, and most preferably <5 µm, based on the wafer or substrate size employed, based on wafer or substrate sizes in a range >100 mm in diameter, in particular with a lateral dimension of 100 mm×100 mm, preferably based on wafer or substrate sizes in a range >200 mm in diameter, in particular with a lateral dimension of 200 mm×200 mm, and most preferably based on wafer or substrate sizes in a range >400 mm in diameter, in particular with a lateral dimension of 400 mm×400 mm. Thus, the specified values typically relate to wafer or substrate sizes in a range of >100 mm in diameter or a size of 100 mm×100 mm, preferably >200 mm in diameter or a size of 200 mm×200 mm, and more preferably >400 mm in diameter or a size of 400 mm×400 mm.

In the context of the present application, a shaped body is considered to be of sheet type if the dimension of the element in one spatial direction is smaller by at least half an order of magnitude than in the two other spatial directions. In the context of the present application a shaped body is considered as being discrete if it is separable as such from the electrical storage system under consideration, that is to say it may in particular as well be provided alone.

The high uniformity of the thickness distribution of the sheet-type discrete element is essential for keeping a consistent quality from cell to cell. Thin film batteries are mostly manufactured at wafer level, with or without masking, and are then cut out. In the case of insufficient thickness consistency, the cells on a wafer or at least from wafer to wafer might have different thicknesses and hence different specifications, e.g. with respect to weight/energy density. This is disadvantageous in particular when the application requires an extremely homogeneous consistency of the product specifications of the electrical storage element. With a low total thickness variation, costs can be saved in quality inspection and production rejects can be avoided.

If the sheet-type discrete element is used as a substrate for the deposition of a thin film storage element, a further result of the high uniformity of the thickness distribution is that the layers are deposited evenly and without lateral variation of the layer thickness distribution. This in turn leads to the situation that in case of subsequent process steps, for example annealing of the LCO layer after deposition thereof, local stresses in the individual layers or between the individual layers at the respective interfaces are prevented, in particular also at the interfaces between layer and substrate. In this way, cracks and detachments are efficiently avoided.

It has been found, namely, that the failure of layers, in particular in the form of cracks occurring in the layer or delamination of the layers from the substrate, is not so much caused by the presence of surface unevenness of the substrate but rather by a combination of thickness variations of the substrate and forces which are transferred to the substrate during the detachment of the substrate from the so-called carrier.

Furthermore, it has been found advantageous if the sheet-type discrete element is selectively adjustable with respect to its properties in the UV range, i.e. absorptance or transmittance, depending on the exactly selected compositions.

Such selectively adjusted transmittance makes it possible to perform a variety of process steps simply by a treatment with electromagnetic radiation, for example: promoting the debonding of the substrate from the carrier, since in this way the organic adhesive layers can be disintegrated particularly effectively; curing encapsulation layers for protecting the storage element against an attack of corrosive media, for example oxygen and/or water vapor, such as described in DE 10 2012 206 273 A1, for example; and annealing the lithium-cobalt oxide layer by high-energy radiation in order to provide, preferably quantitatively, the desired crystallographic high-temperature phase with its high specific storage density.

According to a further embodiment of the invention, the sheet-type discrete element according to the invention has a thickness of not more than 2 mm, preferably less than 1 mm, more preferably less than 500 µm, and yet more preferably of less than or equal to 200 µm. Most preferred is a thickness of the substrate of not more than 100 µm.

For example it is possible to directly produce sheet-type discrete elements in the desired thickness. However, it is also possible to obtain the desired thickness by thinning thicker sheet-type discrete elements in a process step following the fabrication or further processing, for example by one or more of the processes grinding, etching, and polishing.

In a further embodiment of the invention, the sheet-type discrete element exhibits a water vapor transmission rate (WVTR) of $<10^{-3}$ g/(m²·d), preferably of $<10^{-5}$ g/(m²·d), and most preferably of $<10^{-6}$ g/(m²·d).

In a further embodiment, the sheet-type discrete element has a specific electrical resistance at a temperature of 350° C. and at an alternating current with a frequency of 50 Hz that is greater than $1.0*10^6$ Ohm·cm.

The sheet-type discrete element furthermore preferably exhibits a maximum temperature resistance, or maximum load temperature of at least 300° C., preferably at least 400° C., and most preferably at least 500° C., and a coefficient of linear thermal expansion α in a range from $2.0*10^{-6}$/K to $10*10^{-6}$/K, preferably from $2.5*10^{-6}$/K to $9.5*10^{-6}$/K, and most preferably from $3.0*10^{-6}$/K to $9.5*10^{-6}$/K. It has been found that particularly good layer qualities can be achieved in a thin film storage element when the following relationship holds for the maximum load temperature $\theta_{Max}$, in ° C., and the coefficient of linear thermal expansion α: $600·10^{-6} \leq \theta_{Max}·\alpha \leq 8000·10^{-6}$, particularly preferably $800·10^{-6} \leq \theta_{Max}·\alpha \leq 5000·10^{-6}$.

Here, unless otherwise stated, the linear coefficient of thermal expansion α is given for a range from 20 to 300° C. The notations α and $\alpha_{(20-300)}$ are used synonymously throughout the disclosure of the present application. The given value is the nominal coefficient of mean linear thermal expansion according to ISO 7991, which is determined in static measurement.

In the context of the present application, the maximum load temperature $\theta_{Max}$ is considered as a temperature at which the functional integrity of the material is still fully ensured and at which decomposition and/or degradation reactions of the material have not yet started. Naturally this temperature is defined differently depending on the material used. For oxidic crystalline materials, the maximum load temperature is usually given by the melting point; for glasses usually the glass transition temperature $T_g$ is assumed for organic glasses the decomposition temperature may even be below $T_g$; and for metals or metal alloys the maximum load temperature can be approximately indicated by the melting point, unless the metal or the metal alloy reacts in a degradation reaction below the melting point.

The transformation temperature $T_g$ is defined by the point of intersection of the tangents to the two branches of the expansion curve during a measurement with a heating rate of 5 K/min. This corresponds to a measurement according to ISO 7884-8 or DIN 52324, respectively.

In a further embodiment, this at least one surface is designed as a barrier against alkali or alkaline earth ions.

This metal is preferably lithium.

In a further embodiment, this barrier layer provided on at least one surface of the sheet-type element is formed by doping or overdoping with an alkali metal and/or an alkaline earth metal, such as, e.g., lithium. It has been found that already low contents of lithium can prevent or reduce a diffusion of this element from the layer materials of the electrical storage element, such as for example LiPON or metallic lithium, into the sheet-type discrete element.

The sheet-type discrete element is preferably formed in a manner so that the sheet-type discrete element contains lithium, which lithium may already be added during the making of the sheet-type discrete element, as a precursor, or may subsequently be introduced into it, for example by a diffusion process. If the sheet-type discrete element is made of glass, the lithium may therefore already be added as a starting material in the synthesis, or may be introduced into an initially lithium-free glass by a subsequent diffusion process, for example by an ion exchange in an exchange bath during a chemical toughening process of the glass.

Furthermore, a combination of these processes is also possible according to a further embodiment of the invention. For example, a sheet-type discrete element already containing lithium in the bulk composition may subsequently incorporate additional lithium through a suitable process.

In one embodiment of the invention, the lithium may be uniformly distributed over the entire volume of the discrete sheet-type element. According to a further embodiment of the invention, however, it is also possible that the concentration of lithium varies over the cross section of the sheet-type discrete element, that is to say, for example, the lithium concentration decreases toward the surfaces of the sheet-type discrete element so that the sheet-type discrete element exhibits a concentration gradient of the lithium distribution.

According to one embodiment of the invention, such a gradient may for example be achieved by an ion exchange process in which lithium is subsequently introduced into a sheet-type discrete element or in which the lithium content of a sheet-type discrete element which initially already contained lithium is increased. Furthermore, however, according to another embodiment of the invention it is also possible that such a gradient is established during the process of making the sheet-type discrete element itself. This may be achieved, for example, by suitable a temperature control during manufacturing in a manner so that, for example, due to an evaporation of lithium a depletion of lithium is resulting at the surfaces of the sheet-type discrete element.

A diffusion of lithium ions into the sheet-type discrete element and thus a modification and/or destabilization of the internal structure thereof may occur in various ways. The penetration of $Li^+$ caused by a contact with Li metal is preceded by a previous redox reaction with polyvalent ions in the glass, for example $Ti^{4+}$. Due to a reduction of the $Ti^{4+}$ to $Ti^{3+}$, $Li^0$ becomes $Li^+$ which diffuses into the substrate and alters or destabilizes the structure thereof. This can be prevented by having no polyvalent ions in the sheet-type discrete element, or by keeping low the content of polyvalent ions and doping or overdoping with lithium.

Furthermore, lithium ions from the electrolyte of the battery system, for example LiPON, may penetrate into and damage the sheet-type discrete element upon contact therewith. At the same time with the diffusion of the $Li^+$ into the sheet-type discrete element there is a diffusion of alkali and/or alkaline earth ions from the sheet-type discrete element into the layer system of the battery. In order to prevent damage on both sides, i.e. of both the sheet-type discrete element and the battery, doping or overdoping with lithium has to be accomplished. However, the additional content of alkali and/or alkaline earth ions other than lithium in the sheet-type discrete element should not be too great so as to prevent them from penetrating into the battery layers anyway. Basically, suitable ratios of the alkali ions Li, Na, Ka have to be adjusted in the sheet-type discrete element for exploiting mixed alkali effects so as to prevent both Li diffusion into the substrate and mobilization of substrate constituents into the battery layers. In this respect, it does not matter whether polyvalent ions are present in the sheet-type discrete element.

The introduction of Li into the sheet-type discrete element for the barrier effect is possible through the melting process. Moreover, a complete ion exchange across the entire thickness of the sheet is possible due to the small thickness of the sheet-type discrete elements.

In order to examine the sheet-type discrete elements for their contact stability against lithium ions, the samples are introduced into liquid lithium nitrate ($LiNO_3$) for 10 minutes. The molten salt has a temperature of about 380° C. The samples are then removed and freed from dried salt residues. Once the samples have cooled, a depth profile can be acquired by a suitable analysis method, for example Time-of-Flight Secondary Ion Mass Spectroscopy (ToF-SIMS), which shows the profile of the $Li^+$ signal as a function of sputtering time and hence removal depth of the sample. ToF-SIMS is a very sensitive analysis method which is in particular capable of detecting lithium in very low concentrations.

An alternative method for examining the stability of substrates against $Li^+$ is sputter deposition of LiPON. By way of example, the following coating parameters are selected, with a resulting layer thickness being in a range from 1.0 to 1.2 μm:
Sputter target: $Li_3PO_4$
Reaction gas in the chamber: $N_2$
Process duration: 4 h 30 min
Process pressure: $5*10^{-3}$ mbar.

By choosing nitrogen $N_2$ as the process gas, LiPON will be formed during sputtering.

Due to the sputtering process, system- or principle-related elevated temperatures are caused on the coated substrate. The temperature on the lower surface was measured using a temperature-sensitive label and signals temperatures of about 80° C. The temperatures on the coating side are then at about 100° C. to 120° C.

Another method for examining the contact stability of the sheet-type discrete elements against lithium metal involves pressing a lithium metal strip onto the sheet-type discrete element. The lithium metal sample has a thickness of 100 μm and a surface area of 3 mm×3 mm and was pressed onto samples of a size of 20 mm×20 mm in a glove box and then welded air-tightly and under vacuum. The samples were then placed in a press, and the lithium metal was pressed onto the sheet-type discrete element with a pressure of 1.5 bar for 1 minute to improve the contact between the two materials. The whole was stored for one week at room temperature. Thereafter, the lithium metal was removed from the sheet-type discrete element by reaction with distilled water, and the sheet-type discrete elements were examined for discolorations.

An alternative method for examining the stability of substrates against metallic $Li^0$ is thermal vapor deposition. By way of example, the following coating parameters are selected, with a resulting layer thickness ranging from 1.1 to 1.9 μm:
Process duration: 8 min 11 sec
Basic pressure: $2*10^{-6}$ mbar.
Process duration is controlled via a quartz oscillator as a layer thickness sensor.

Due to the evaporation process, system—or principle-related slightly elevated system—or principle-related temperatures are caused on the coated substrate, which are however lower than with the LiPON coating and are estimated to a value of about 50° C.

According to a further embodiment of the invention, the sheet-type element according to the invention consists of at least one oxide or a mixture or compound of oxides.

In a further embodiment of the invention, this at least one oxide is $SiO_2$.

In a further embodiment of the invention, the sheet-type element is made of glass. Within the context of the present application, the term 'glass' refers to a material which is essentially inorganic in nature and predominantly consists of compounds of metals and/or semimetals with elements of groups VA, VIA, and VIIA of the periodic table of elements, but preferably with oxygen, and which is characterized by an amorphous state, i.e. a three-dimensional state without periodical order, and by a specific electrical resistance of greater than $1.0*10^6$ Ohm·cm, at a temperature of 350° C. and at an alternating current with a frequency of 50 Hz. Hence, in particular the amorphous material LiPON which is used as a solid-state ion conductor is not considered to be a glass in the sense of the present application.

According to a further embodiment of the invention, the sheet-type element of the invention is obtained by a melting process.

Preferably, the sheet-type element is formed into a sheet-type shape in a shaping process following the melting process. This shaping may be performed directly following the melting (known as hot forming). However, it is as well possible that first a solid, essentially non-shaped body is obtained which is transformed into a sheet-type state in a further step, by reheating and mechanical reshaping.

If the shaping of the sheet-type element is accomplished by a hot forming process, this will, according to one embodiment of the invention, involve drawing processes, for example down-draw, up-draw, or overflow fusion processes. However, other hot forming processes are also possible, for example shaping in a float process.

The sheet-type discrete element can be used in an electrical storage system, in particular as a substrate for depositing functional energy storage layers. According to yet another embodiment of the invention, it is also possible to use the sheet-type discrete element for covering a structure of functional layers of an electrical storage system, or as a superstrate. Such a cover with a superstrate may be defined by the superstrate itself as an outermost layer against the environment of the respective region or item covered therewith, such as the outermost layer of an electrical storage element.

EXAMPLES

The following tables list some exemplary compositions of sheet-type elements according to the invention.

All the exemplary embodiments mentioned below may optionally contain 0 to 1 wt % of refining agents, unless already listed, such as, for example, $SnO_2$, $CeO_2$, $As_2O_3$, $Cl^-$, $F^-$, sulfates.

Exemplary Embodiment 1

The composition of the sheet-type discrete element is given, by way of example, by the following composition, in wt %:

| | |
|---|---|
| $SiO_2$ | 58 to 65 |
| $B_2O_3$ | 6 to 10.5 |
| $Al_2O_3$ | 14 to 25 |
| MgO | 0 to 5 |
| CaO | 0 to 9 |
| BaO | 0 to 8, preferably 3 to 8 |
| SrO | 0 to 8 |
| ZnO | 0 to 2, | wherein a total of the contents of MgO, CaO, SrO, and BaO is in a range from 8 to 18 wt %, and wherein, additionally, further constituents may be included in the form of impurities or of necessary processing-related additives, for example refining agents, with a total of these constituents elements amounting to not more than 2 wt %.

Exemplary Embodiment 2

The composition of the sheet-type discrete element is furthermore given, by way of example, by the following composition, in wt %:

| | |
|---|---|
| $SiO_2$ | 55 to 75 |
| $Na_2O$ | 0 to 15 |
| $K_2O$ | 0 to 14 |
| $Al_2O_3$ | 0 to 15 |
| MgO | 0 to 4 |
| CaO | 3 to 12 |
| BaO | 0 to 15 |
| ZnO | 0 to 5 |
| $TiO_2$ | 0 to 1, preferably 0 to 2. |

Exemplary Embodiment 3

The composition of the sheet-type discrete element is furthermore given, by way of example, by the following composition, in wt %:

| | |
|---|---|
| $SiO_2$ | 50 to 66 |
| $B_2O_3$ | 0 to 5.5 |
| $Al_2O_3$ | 13 to 35 |
| MgO | 0 to 7 |
| CaO | 5 to 14 |
| SrO | 0 to 8 |
| BaO | 6 to 18 |
| $P_2O_5$ | 0 to 2 |
| $ZrO_2$ | 0 to 3 |
| $TiO_2$ | 0 to 2 |
| $CeO_2$ | 0 to 5 |
| $MoO_3$ | 0 to 5 |
| $Fe_2O_3$ | 0 to 5 |
| $WO_3$ | 0 to 5 |
| $Bi_2O_3$ | 0 to 5. |

Exemplary Embodiment 4

The composition of the sheet-type discrete element is furthermore given, by way of example, by the following composition, in wt %:

| | |
|---|---|
| $SiO_2$ | 50 to 66 |
| $B_2O_3$ | 0 to less or equal to 0.5 |
| $Al_2O_3$ | 14 to 35 |
| MgO | 0 to 7 |
| CaO | 5 to 14 |
| SrO | 0 to 8 |
| BaO | 6 to 18 |
| $P_2O_5$ | 0 to 2 |
| $ZrO_2$ | 0 to 3. |

Exemplary Embodiment 5

Yet another sheet-type discrete element is given, by way of example, by the following composition, in wt %:

| | |
|---|---|
| $SiO_2$ | 30 to 85 |
| $B_2O_3$ | 3 to 20 |
| $Al_2O_3$ | 0 to 15 |
| $Na_2O$ | 3 to 15 |
| $K_2O$ | 3 to 15 |
| ZnO | 0 to 12 |
| $TiO_2$ | 0.5 to <2 |
| CaO | 0 to 0.1. |

Exemplary Embodiment 6

Yet another sheet-type discrete element is given, by way of example, by the following composition, in wt %:

| | |
|---|---|
| $SiO_2$ | 80 +/− 5 |
| $B_2O_3$ | 13 +/− 5 |
| $Al_2O_3$ | 2.5 +/− 2 |
| $Na_2O$ | 3.5 +/− 2 |
| $K_2O$ | 1 +/− 1. |

Exemplary Embodiment 7

Yet another sheet-type discrete element is given, by way of example, by the following composition, in wt %:

| | |
|---|---|
| SiO$_2$ | 50 to 65 |
| Al$_2$O$_3$ | 15 to 20 |
| B$_2$O$_3$ | 0 to 6 |
| Li$_2$O | 0 to 6 |
| Na$_2$O | 8 to 15 |
| K$_2$O | 0 to 5 |
| MgO | 0 to 5 |
| CaO | 0 to 7, preferably 0 to 1 |
| ZnO | 0 to 4, preferably 0 to 1 |
| ZrO$_2$ | 0 to 4 |
| TiO$_2$ | 0 to 1, preferably substantially free of TiO$_2$. |

Exemplary Embodiment 8

Yet another sheet-type discrete element is given, by way of example, by the following composition, in wt %:

| | |
|---|---|
| SiO$_2$ | 59.7 |
| Al$_2$O$_3$ | 17.1 |
| B$_2$O$_3$ | 7.8 |
| MgO | 3.4 |
| CaO | 4.2 |
| SrO | 7.7 |
| BaO | 0.1. |

With this composition, the following properties of the sheet-type discrete element are obtained:

| | |
|---|---|
| $\alpha_{(20\text{-}300)}$ | 3.8 ppm/K |
| T$_g$ | 719° C. |
| Density | 2.51 g/cm$^3$. |

Exemplary Embodiment 9

Yet another sheet-type discrete element is given, by way of example, by the following composition, in wt %:

| | |
|---|---|
| SiO$_2$ | 59.6 |
| Al$_2$O$_3$ | 15.1 |
| B$_2$O$_3$ | 9.7 |
| CaO | 5.4 |
| SrO | 6.0 |
| BaO | 2.3 |
| ZnO | 0.5 |
| Sb$_2$O$_3$ | 0.4 |
| As$_2$O$_3$ | 0.7. |

With this composition, the following properties of the sheet-type discrete element are obtained:

| | |
|---|---|
| $\alpha_{(20\text{-}300)}$ | 3.8 ppm/K |
| Density | 2.5 g/cm$^3$. |

Exemplary Embodiment 10

Yet another sheet-type discrete element is given, by way of example, by the following composition, in wt %:

| | |
|---|---|
| SiO$_2$ | 58.8 |
| Al$_2$O$_3$ | 14.6 |
| B$_2$O$_3$ | 10.3 |
| MgO | 1.2 |
| CaO | 4.7 |
| SrO | 3.8 |
| BaO | 5.7 |
| Sb$_2$O$_3$ | 0.2 |
| As$_2$O$_3$ | 0.7. |

With this composition, the following properties of the sheet-type discrete element are obtained:

| | |
|---|---|
| $\alpha_{(20\text{-}300)}$ | 3.73 ppm/K |
| T$_g$ | 705° C. |
| Density | 2.49 g/cm$^3$. |

Exemplary Embodiment 11

Yet another sheet-type discrete element is given, by way of example, by the following composition, in wt %:

| | |
|---|---|
| SiO$_2$ | 62.5 |
| B$_2$O$_3$ | 10.3 |
| Al$_2$O$_3$ | 17.5 |
| MgO | 1.4 |
| CaO | 7.6 |
| SrO | 0.7. |

With this composition, the following properties of the sheet-type discrete element are obtained:

| | |
|---|---|
| $\alpha_{(20\text{-}300)}$ | 3.2 ppm/K |
| Density: | 2.38 g/cm$^3$. |

Exemplary Embodiment 12

Another sheet-type discrete element is given, by way of example, by the following composition, in wt %:

| | |
|---|---|
| SiO$_2$ | 69 +/− 5 |
| Na$_2$O | 8 +/− 2 |
| K$_2$O | 8 +/− 2 |
| CaO | 7 +/− 2 |
| BaO | 2 +/− 2 |
| ZnO | 4 +/− 2 |
| TiO$_2$ | 1 +/− 1. |

With this composition, the following properties of the sheet-type discrete element are obtained:

| | |
|---|---|
| $\alpha_{(20\text{-}300)}$ | $9.4 \cdot 10^{-6}$/K |
| T$_g$ | 533° C. |
| Density | 2.55 g/cm$^3$. |

Exemplary Embodiment 13

Yet another sheet-type discrete element is given, by way of example, by the following composition, in wt %:

| | |
|---|---|
| $SiO_2$ | 62.3 |
| $Al_2O_3$ | 16.7 |
| $Na_2O$ | 11.8 |
| $K_2O$ | 3.8 |
| $MgO$ | 3.7 |
| $ZrO_2$ | 0.1 |
| $CeO_2$ | 0.1 |
| $TiO_2$ | 0.8 |
| $As_2O_3$ | 0.7. |

With this composition, the following properties of the sheet-type discrete element are obtained:

| | |
|---|---|
| $\alpha_{(20-300)}$ | $8.6 \cdot 10^{-6}/K$ |
| $T_g$ | 607° C. |
| Density | 2.4 g/cm³. |

Exemplary Embodiment 14

Yet another sheet-type discrete element is given, by way of example, by the following composition, in wt %:

| | |
|---|---|
| $SiO_2$ | 52 |
| $Al_2O_3$ | 17 |
| $Na_2O$ | 12 |
| $K_2O$ | 4 |
| $MgO$ | 4 |
| $CaO$ | 6 |
| $ZnO$ | 3.5 |
| $ZrO_2$ | 1.5. |

With this composition, the following properties of the sheet-type discrete element are obtained:

| | |
|---|---|
| $\alpha_{(20-300)}$ | $9.7 \cdot 10^{-6}/K$ |
| $T_g$ | 556° C. |
| Density | 2.6 g/cm³. |

Exemplary Embodiment 15

Yet another sheet-type discrete element is given, by way of example, by the following composition, in wt %:

| | |
|---|---|
| $SiO_2$ | 62 |
| $Al_2O_3$ | 17 |
| $Na_2O$ | 13 |
| $K_2O$ | 3.5 |
| $MgO$ | 3.5 |
| $CaO$ | 0.6 |
| $SnO_2$ | 0.1 |
| $TiO_2$ | 0.6. |

With this composition, the following properties of the sheet-type discrete element are obtained:

| | |
|---|---|
| $\alpha_{(20-300)}$ | $8.3 \ast 10^{-6}/K$ |
| $T_g$ | 623° C. |
| Density | 2.4 g/cm³. |

Exemplary Embodiment 16

Yet another sheet-type discrete element is given, by way of example, by the following composition, in wt %:

| | |
|---|---|
| $SiO_2$ | 55 to 75 |
| $Na_2O$ | 0 to 15 |
| $K_2O$ | 0 to 14 |
| $Al_2O_3$ | 0 to 15 |
| $MgO$ | 0 to 4 |
| $CaO$ | 3 to 12 |
| $BaO$ | 0 to 15 |
| $ZnO$ | 0 to 5. |

Exemplary Embodiment 17

Yet another sheet-type discrete element is given, by way of example, by the following composition, in wt %:

| | |
|---|---|
| $SiO_2$ | 74.3 |
| $Na_2O$ | 13.2 |
| $K_2O$ | 0.3 |
| $Al_2O_3$ | 1.3 |
| $MgO$ | 0.2 |
| $CaO$ | 10.7. |

With this composition, the following properties of the sheet-type discrete element are obtained:

| | |
|---|---|
| $\alpha_{(20-300)}$ | 9.0 ppm/K |
| $T_g$ | 573° C. |

Exemplary Embodiment 18

Yet another sheet-type discrete element is given, by way of example, by the following composition, in wt %:

| | |
|---|---|
| $SiO_2$ | 72.8 |
| $Na_2O$ | 13.9 |
| $K_2O$ | 0.1 |
| $Al_2O_3$ | 0.2 |
| $MgO$ | 4.0 |
| $CaO$ | 9.0. |

With this composition, the following properties of the sheet-type discrete element are obtained:

| | |
|---|---|
| $\alpha_{(20-300)}$ | 9.5 ppm/K |
| $T_g$ | 564° C. |

For a better explanation of the invention, FIG. 1 gives further specific exemplary embodiments (EE) for sheet-type discrete elements according to the invention, which were examined for their contact stability against lithium. Also given are comparative examples (CE) of non-inventive sheet-type discrete elements in terms of their contact stability with respect to metallic lithium and lithium ions.

The specified values on the composition of the examples listed there are given in percent by weight (wt %) in each case. Also given, as far as known, are the values for the coefficient of thermal expansion α in the range from 20 to 300° C. in ppm/K, the transformation temperature $T_g$ in ° C., and the density in g/cm$^3$.

In FIG. 1, contact stability of the sheet-type discrete element against Li metal or LiNO$_3$ is evaluated qualitatively. In detail, the rating means:

++ no changes visible
+ minimal changes discernable
0 slight haze or discoloration, possibly not only on the surface
− significant discoloration or haze
−− sample reacted strongly/alteration extends significantly into the depth of the sample Based on the examinations it was found that a content of titanium oxide as an example for a content of a polyvalent element in the composition of the sheet-type discrete element is unfavorable with respect to the contact to Li metal. The polyvalent element is reduced by lithium metal, as can be seen, for example, from Comparative Example 1 (CE1). The contact stability against lithium metal can be improved if, in addition to the polyvalent element such as titanium, alkaline ions, in particular also lithium ions, are contained in the composition of the sheet-type discrete element. This can be seen in particular from a comparison of Comparative Examples 2 and 3 (CE2 and CE3). Comparative Example 2 contains 14.89 wt % as a total content of alkali oxides and 3.9 wt % of TiO$_2$ and exhibits improved contact stability against lithium metal compared to Comparative Example 3 which contains a total content of alkali oxides of only 4.0 wt % and 2.5 wt % of TiO$_2$.

By contrast, if no TiO$_2$ is contained in the composition of the sheet-type discrete element, the stability against lithium metal is improved overall if further alkali ions other than lithium are present (see Exemplary Embodiment 24) and is even further improved if lithium is added (see Exemplary Embodiments 25 and 27).

However, a small content of TiO$_2$ can be contained in the composition of the sheet-type discrete element without impairing the stability against lithium metal. A content of less than or equal to 2.0 wt % of TiO$_2$ is still permissible in order to achieve the desired inertness of the sheet-type discrete element against contact with lithium metal.

The sheet-type discrete element thus preferably has a composition which is characterized by a TiO$_2$ content of at most 2 wt %, preferably by at most 0.5 wt % of TiO$_2$, and is most preferably free of TiO$_2$.

According to a particularly preferred embodiment, the sheet-type discrete element is formed from a glass with a composition that is characterized by a content of at most 2 wt % of TiO$_2$, preferably at most 0.5 wt % of TiO$_2$, and which is most preferably free of TiO$_2$.

In terms of stability upon contact with lithium ions it has been found that in the case of a sheet-type discrete element with no or only a small content of alkali ions other than lithium, very good contact stability against lithium ions is provided. In the case of sheet-type discrete elements with a high content of sodium and potassium oxide, the contact stability of the sheet-type discrete element against lithium ions can be further improved by an addition of lithium.

Furthermore, unless a content of Li$_2$O is already contained in the composition, it is possible to modify the listed exemplary embodiments so that they contain a significant content of Li$_2$O exceeding the content of unavoidable traces. Such a proportion is given with a Li$_2$O content of greater than or equal to 0.1 wt %.

The modification with the compositions of the sheet-type discrete elements may be accomplished by proportionately reducing the proportion of any other alkali metal oxides contained in the composition of the sheet-type discrete element so that the content of the remaining constituents relative to the alkali metal oxides remains the same, or else the Li$_2$O is added in addition to the other constituents, so that their proportion is correspondingly reduced.

If Li$_2$O is contained in a sheet-type discrete element, its proportion amounts to at least 0.1 wt % and is furthermore less than 7.0 wt %, preferably less than 5.2 wt %, more preferably less than 2.5 wt %, yet more preferably less than 0.5 wt %, and most preferably less than 0.2 wt %.

According to a further preferred embodiment of the invention, the sheet-type discrete element is made of a glass with a composition that is free of TiO$_2$, except for impurities that are present in traces, and is furthermore characterized by a content of Li$_2$O of 7.0 wt % or less, preferably 5.2 wt % or less, more preferably 2.5 wt % or less, yet more preferably 0.5 wt % or less, and most preferably 0.2 wt % or less, the content of Li$_2$O being at least 0.1 wt %.

Furthermore, it is possible that the inorganic silicon-containing, in particular silicatic, substantially fluid-free material has been subjected to a particular treatment which increases the strength of the material. If the material is a glass, such a treatment in particular includes toughening, for example thermal and/or chemical toughening, in particular chemical toughening.

In this case, the chemical toughening of a glass is achieved by an ion exchange in an exchange bath. If a toughened glass is employed, this is characterized, prior to the application of functional layers of an electrical storage system, by a chemically produced prestress that is characterized by a thickness of the ion exchange depth of layer $L_{DoL}$ of at least 10 μm, preferably at least 15 μm, and most preferably at least 25 μm, and by a compressive stress ($\sigma_{CS}$) at the surface of the glass of preferably at least 100 MPa, more preferably at least 200 MPa, yet more preferably at least 300 MPa, and most preferably 480 MPa or more.

During the application and subsequent treatment of functional layers of an electrical storage system, the stress condition of the glass used as the substrate might be altered due to process related reasons. Surprisingly, it has been found that the prestress of the glass is hereby not reduced to zero, but that rather a residual stress is preserved in the glass, so that altogether the strength of the glass used as a substrate is increased compared to a conventional non-toughened glass.

The glass as provided as a substrate in the completed energy storage may therefore be distinguished by being an at least partially chemically toughened glass, wherein the at least partial chemical toughening is achieved by an ion exchange in an exchange bath and a subsequent thermal treatment and is characterized by a thickness of the ion exchange depth of layer ($L_{DoL}$) of at least 10 μm, preferably at least 15 μm, and most preferably at least 25 μm, and by a compressive stress ($\sigma_{CS}$) at the glass surface of at least 100 MPa, preferably at least 200 MPa, more preferably at least 300 MPa, and most preferably 480 MPa or more, wherein the thickness of the ion exchange layer prior to a thermal stress is smaller than the thickness of the ion exchange layer after a thermal stress, and wherein the compressive stress at the surface of the glass prior to the thermal stress is greater than the compressive stress at the surface of the glass after the thermal stress.

In one embodiment of the invention, the chemical toughening of the glass is achieved in an exchange bath containing lithium ions, such as, an exchange bath with different alkali ions, e.g. potassium and low to lowest contents of lithium. Also, a cascaded process may be performed, for example an exchange with potassium and a further, rapid exchange using a lithium-containing bath.

BRIEF DESCRIPTION OF THE DRAWINGS

FIG. 1 shows contact stability of specific exemplary embodiments (EE) for sheet-type discrete elements according to the invention and comparative examples (CE) of non-inventive sheet-type discrete elements;

FIG. 7a through 7e shows photographs of sheet-type discrete elements after exposure to metallic lithium.

DETAILED DESCRIPTION

Figures 2, 3:
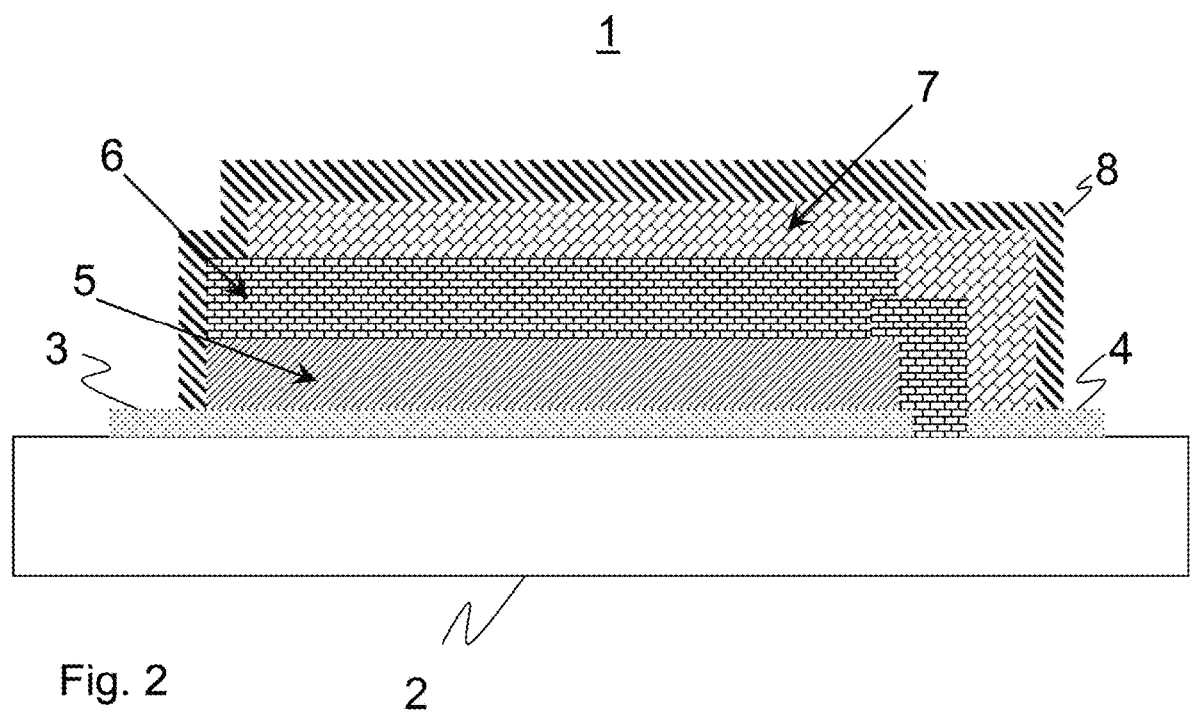
FIG. 2 shows a schematic view of an electrical storage element.
FIG. 3 is a schematic view of a sheet-type discrete element.

FIG. 2 schematically shows an electrical storage system 1 according to the present invention. It comprises a sheet-type discrete element 2 which is used as a substrate. A sequence of different layers is applied on the substrate. By way of example and without being limited to the present example, first the two collector layers are applied on the sheet-type discrete element 2, cathode collector layer 3, and anode collector layer 4. Such collector layers usually have a thickness of a few micrometers and are made of a metal, for example of copper, aluminum, or titanium. Superimposed on collector layer 3 is cathode layer 5. If the electrical storage system 1 is a lithium-based thin film battery, the cathode is made of a lithium-transition metal compound, preferably an oxide, for example of $LiCoO_2$, of $LiMnO_2$, or else of $LiFePO_4$. Furthermore, the electrolyte 6 is applied on the substrate and is at least partially overlapping cathode layer 5, and in the case of a lithium-based thin film battery, this electrolyte is mostly LiPON, a compound of lithium with oxygen, phosphorus, and nitrogen. Furthermore, the electrical storage system 1 comprises an anode 7 which may for instance be made of lithium titanium oxide or else of metallic lithium. Anode layer 7 is at least partially overlapping electrolyte layer 6 and collector layer 4. Furthermore, the battery 1 comprises an encapsulation layer 8.

In the context of the present invention, any material which is capable of preventing or greatly reducing the attack of fluids or other corrosive materials on the electrical storage system 1 is considered as an encapsulation or sealing of the electrical storage system 1.

FIG. 3 schematically illustrates a sheet-type discrete element according to the present invention, here in the form of a sheet-type shaped body 10. In the context of the present invention, a shaped body is referred to as being of sheet type or a sheet if its dimension in one spatial direction is not more than half of that in the two other spatial directions. A shaped body is referred to as a ribbon in the present invention if it has a length, width, and thickness for which the following relationship applies: the length is at least ten times larger than the width which in turn is at least twice as large as the thickness.

Figure 4:
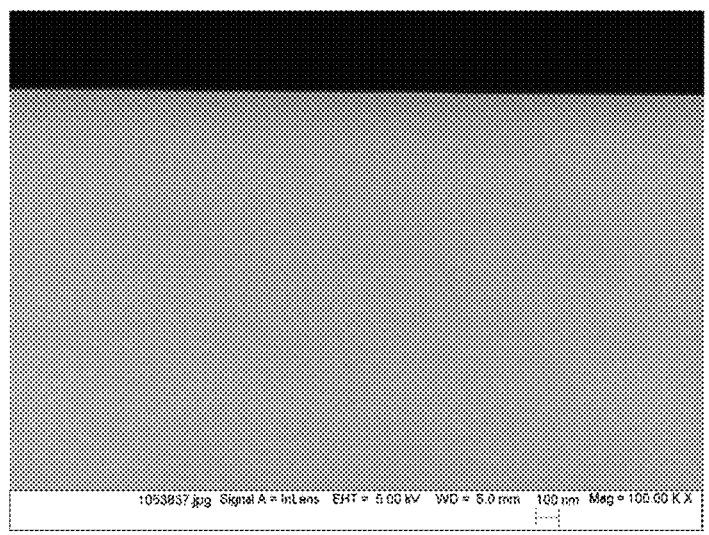
FIGS. 4 through 6 are scanning electron micrographs of discrete sheet-type elements.

FIG. 4 is a scanning electron micrograph showing the breaking edge of a sheet-type discrete element with the composition according to Exemplary Embodiment 5 (EE5) after contact of the surface of the sheet-type discrete element with lithium metal. The breaking edge of the sheet-type discrete element is uniform both at the surface and in the bulk material. There has thus been occurred no degradation of the surface of the sheet-type discrete element due to the contact with lithium metal.

Figure 5:
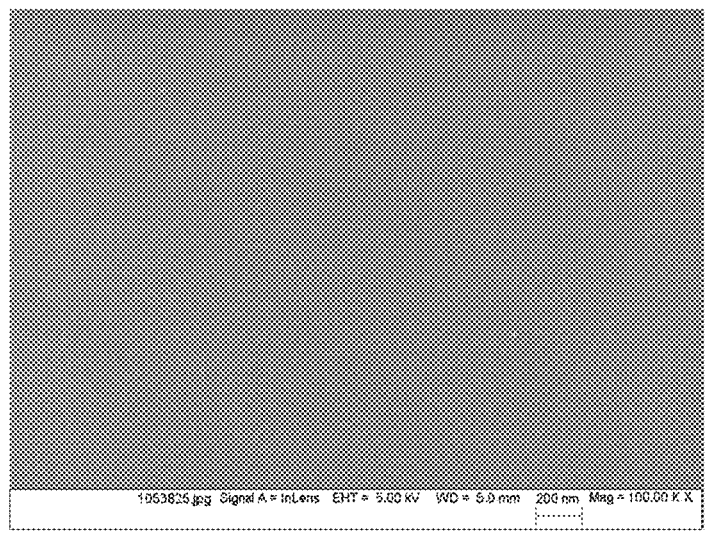

FIG. 5 shows the surface of a sheet-type discrete element corresponding to the composition of Comparative Example 1 (CE1) prior to the contact with lithium metal.

Figure 6:
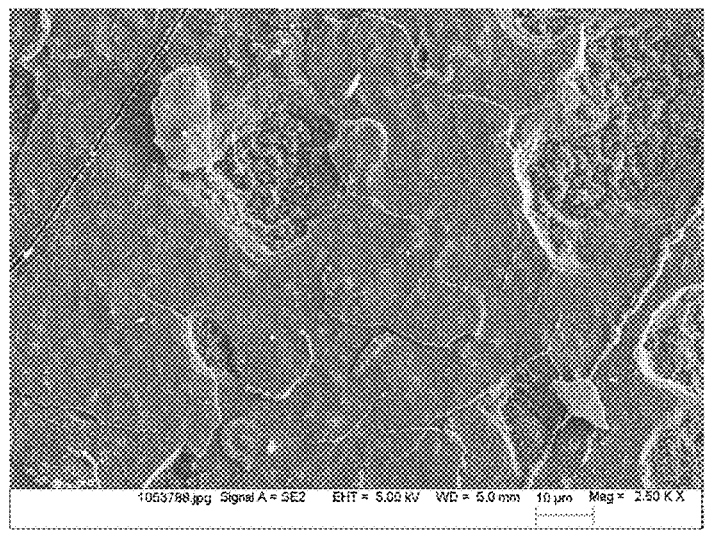

FIG. 6 shows the surface of a sheet-type discrete element corresponding to the composition of Comparative Example 1 (CE1) after contact with lithium metal. Clearly visible, the surface of the sheet-type discrete element has been strongly degraded, resulting in chipping at the surface and considerable roughening thereof.

FIGS. 7a through 7e show photographs of different sheet-type discrete elements after a stress test in which the surface of the sheet-type discrete element was coated with lithium metal by vapor deposition. After having been coated with lithium metal by vapor deposition, the respective samples were stored in a glove box under an inert atmosphere. After this storage, the lithium layer was wiped off.

In the case of FIGS. 7a and 7b, which have a composition corresponding to Comparative Examples (CE) 1 and 3, respectively, it has been found that the surface of the samples is changed after removal of the metallic lithium, in particular it exhibits haze or is discolored. By contrast, in case of the examined samples of the Exemplary Embodiments (EE) 31, 32, and 28 shown in FIGS. 7c, 7d, and 7e, respectively, such change, in particular discoloration, has not occurred. According to the inventors, this absence of discoloration is attributable to the absence of a titanium content in the samples, in contrast to the Comparative Examples 1 and 3 in FIGS. 7a and 7b, respectively.

LIST OF REFERENCE NUMERALS

1 Electrical storage system
2 Sheet-type discrete element used as a substrate
3 Cathode collector layer
4 Anode collector layer
5 Cathode
6 Electrolyte
7 Anode
8 Encapsulation layer
10 Sheet-type discrete element in the form of a sheet-type shaped body

What is claimed is:

1. An electrical storage system, comprising:
   at least one sheet-type discrete element having a thickness of less than 2 mm and being made of toughened glass,
   wherein the at least one sheet-type discrete element resists an attack of alkali metals or alkali metal ions,
   wherein the at least one sheet-type discrete element comprises a thickness variation of not more than 25 μm based on wafer or substrate size in a range of >100 mm in diameter,
   wherein the at least one sheet-type discrete element comprises a composition comprising a $TiO_2$ in a content of at most 2 wt % and a compositional range selected from the group consisting of, in wt %:

| Component | No. 1 | No. 2 | No. 3 | No. 4 |
|---|---|---|---|---|
| $SiO_2$ | 58-65 | 55-75 | 75-85 | 50-65 |
| $B_2O_3$ | 6-10.5 | | 8-18 | 0-6 |
| $Al_2O_3$ | 14-25 | 0-15 | 0.5-4.5 | 15-20 |
| $Li_2O$ | 0-7 | | | 0-6 |
| $Na_2O$ | | 0-15 | 1.5-5.5 | 8-15 |
| $K_2O$ | | 0-14 | 0-2 | 0-5 |
| MgO | 0-5 | 0-4 | | 0-5 |
| CaO | 0-9 | 3-12 | | 0-7 |
| BaO | 0-8 | 0-15 | | |
| SrO | 0-8 | | | |
| ZnO | 0-2 | 0-5 | | 0-4 |
| $TiO_2$ | | 0-2 | | 0-1 |
| $ZrO_2$ | | | | 0-4 |
| Total of MgO, CaO, SrO, and BaO. | 8-18 | | | |

2. The electrical storage system as claimed in claim 1, further comprising additional constituents in the form of impurities or of necessary processing-related additives and/or refining agents, with a total of the additional constituents amounting to not more than 2 wt %.

3. The electrical storage system as claimed in claim 1, wherein the compositional range comprises range No. 1 and wherein the BaO content is between 3 wt % and 8 wt %.

4. The electrical storage system as claimed in claim 1, wherein the sheet-type discrete element has an $Li_2O$ content of at least 0.1 wt %.

5. The electrical storage system as claimed in claim 1, wherein the at least one sheet-type discrete element has at least one surface that is inert and/or impermeable to materials coming into contact with the at least one surface.

6. The electrical storage system as claimed in claim 5, wherein the at least one surface is a barrier layer.

7. The electrical storage system as claimed in claim 6, wherein the barrier layer is a barrier against a diffusion of metals.

8. The electrical storage system as claimed in claim 6, wherein the barrier layer is a barrier against a diffusion of alkali metals.

9. The electrical storage system as claimed in claim 8, wherein the barrier layer is formed by doping or overdoping with at least one alkali metal.

10. The electrical storage system as claimed in claim 5, wherein the barrier layer is a barrier to lithium.

11. The electrical storage system as claimed in claim 1, wherein the at least one sheet-type discrete element comprises a water vapor transmission rate (WVTR) of $<10^{-3}$ g/(m²·d).

12. The electrical storage system as claimed in claim 1, wherein the at least one sheet-type discrete element has a thickness of not more than 100 μm.

13. The electrical storage system as claimed in claim 1, wherein the at least one sheet-type discrete element has a specific electrical resistance at a temperature of 350° C. and at alternating current with a frequency of 50 Hz of greater than $1.0*10^6$ Ohm·cm.

14. The electrical storage system as claimed in claim 1, wherein the at least one sheet-type discrete element comprises a maximum load temperature $\theta_{Max}$ of at least 300° C.

15. The electrical storage system as claimed in claim 1, wherein the at least one sheet-type discrete element has a coefficient of linear thermal expansion α in a range from $2.0*10^{-6}$/K to $10*10^{-6}$/K.

16. The electrical storage system as claimed in claim 1, wherein the at least one sheet-type discrete element further comprises a relationship of a product of a maximum load temperature ($\theta_{Max}$) and a coefficient of linear thermal expansion (α) of $600·10^{-6} \leq \theta_{Max}·\alpha \leq 8000·10^{-6}$.

17. The electrical storage system as claimed in claim 1, wherein the at least one sheet-type discrete element further comprises a relationship of a product of a maximum load temperature ($\theta_{Max}$) and a coefficient of linear thermal expansion (α) of $800·10^{-6} \leq \theta_{Max}·\alpha \leq 5000·10^{-6}$.

18. A sheet-type discrete element made of toughened glass, comprising:
a composition that resists an attack of alkali metals or alkali metal ions comprising a $TiO_2$ content of at most 2 wt % and a compositional range selected from the group consisting of, in wt %:

| Component | No. 1 | No. 2 | No. 3 | No. 4 |
|---|---|---|---|---|
| $SiO_2$ | 58-65 | 55-75 | 75-85 | 50-65 |
| $B_2O_3$ | 6-10.5 | | 8-18 | 0-6 |
| $Al_2O_3$ | 14-25 | 0-15 | 0.5-4.5 | 15-20 |
| $Li_2O$ | 0-7 | | | 0-6 |
| $Na_2O$ | | 0-15 | 1.5-5.5 | 8-15 |
| $K_2O$ | | 0-14 | 0-2 | 0-5 |
| MgO | 0-5 | 0-4 | | 0-5 |
| CaO | 0-9 | 3-12 | | 0-7 |
| BaO | 0-8 | 0-15 | | |
| SrO | 0-8 | | | |
| ZnO | 0-2 | 0-5 | | 0-4 |
| $TiO_2$ | | 0-2 | | 0-1 |
| $ZrO_2$ | | | | 0-4 |
| total of MgO, CaO, SrO, and BaO | 8-18 | | | | wherein the at least one sheet-type discrete element comprises a thickness variation of not more than 25 μm based on wafer or substrate size in a range of >100 mm in diameter.

19. The sheet-type discrete element as claimed in claim 18, further comprising additional constituents in the form of impurities or of necessary processing-related additives and/or refining agents, with a total of the additional constituents amounting to not more than 2 wt %.

20. The sheet-type discrete element as claimed in claim 18, wherein the compositional range comprises range No. 1 and wherein the BaO content is between 3 wt % and 8 wt %.

21. The sheet-type discrete element as claimed in claim 18, wherein the composition has an $Li_2O$ content of at least 0.1 wt %.

22. The sheet-type discrete element as claimed in claim 18, further comprising at least one surface that is inert and/or impermeable to materials coming into contact with the at least one surface.

23. The sheet-type discrete element as claimed in claim 22, wherein the at least one surface is a barrier layer.

24. The sheet-type discrete element as claimed in claim 23, wherein the barrier layer is a barrier against a diffusion of metals.

25. The sheet-type discrete element as claimed in claim 23, wherein the barrier layer is a barrier against a diffusion of alkali metals.

26. The sheet-type discrete element as claimed in claim 25, wherein the barrier layer is formed by doping or overdoping with at least one alkali metal.

27. The sheet-type discrete element as claimed in claim 18, further comprising a thickness of less than 2 mm.

28. The sheet-type discrete element as claimed in claim 18, further comprising a water vapor transmission rate (WVTR) of $<10^{-3}$ g/(m²·d).

29. The sheet-type discrete element as claimed in claim 18, further comprising a specific electrical resistance at a temperature of 350° C. and at alternating current with a frequency of 50 Hz of greater than $1.0*10^6$ Ohm·cm.

30. The sheet-type discrete element as claimed in claim 18, further comprising a maximum load temperature $\theta_{Max}$ of at least 300° C.

31. The sheet-type discrete element as claimed in claim 18, further comprising a coefficient of linear thermal expansion $\alpha$ in a range from $2.0*10^{-6}$/K to $10*10^{-6}$/K.

32. The sheet-type discrete element as claimed in claim 18, further comprising a relationship of a product of a maximum load temperature ($\theta_{Max}$) and a coefficient of linear thermal expansion ($\alpha$) of $600 \cdot 10^{-6} \leq \theta_{Max} \cdot \alpha \leq 8000 \cdot 10^{-6}$.

33. The sheet-type discrete element as claimed in claim 18, wherein the sheet-type discrete element is configured for a use elected from the group consisting of a substrate in an electrical storage system, a superstrate in an electrical storage system, and a cover in an electrical storage system.

34. The electrical storage system as claimed in claim 1, wherein the glass is toughened to have a compressive stress ($\sigma CS$) at the surface of the glass of at least 100 MPa.

35. The sheet-type discrete element as claimed in claim 18, wherein the glass is toughened to have a compressive stress ($\sigma CS$) at the surface of the glass of at least 100 MPa.

* * * * *